United States Patent
Lim et al.

(10) Patent No.: US 8,829,598 B2
(45) Date of Patent: Sep. 9, 2014

(54) NON-VOLATILE MEMORY DEVICE HAVING THREE DIMENSIONAL, VERTICAL CHANNEL, ALTERNATELY STACKED GATE ELECTRODE STRUCTURE

(71) Applicant: SK hynix Inc., Gyeonggi-do (KR)

(72) Inventors: Se-Yun Lim, Gyeonggi-do (KR);
Sang-Hyun Oh, Gyeonggi-do (KR);
Gyo-Ji Kim, Gyeonggi-do (KR);
Eun-Seok Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/783,681

(22) Filed: Mar. 4, 2013

(65) Prior Publication Data
US 2013/0175602 A1    Jul. 11, 2013

Related U.S. Application Data

(62) Division of application No. 12/814,009, filed on Jun. 11, 2010, now abandoned.

(30) Foreign Application Priority Data

Jun. 12, 2009 (KR) .......... 10-2009-0052351
Mar. 2, 2010 (KR) .......... 10-2010-0018724

(51) Int. Cl.
*H01L 29/792* (2006.01)
*H01L 27/115* (2006.01)
*H01L 29/66* (2006.01)

(52) U.S. Cl.
CPC ...... *H01L 29/7926* (2013.01); *H01L 27/11582* (2013.01); *H01L 27/11578* (2013.01); *H01L 29/66833* (2013.01); *H01L 29/792* (2013.01)
USPC .................................. 257/324; 257/E21.21

(58) Field of Classification Search
USPC ......... 257/302, 303, 304, 306, 311, 314, 315, 257/316, 324
See application file for complete search history.

(56) References Cited

U.S. PATENT DOCUMENTS

2007/0158736 A1* 7/2007 Arai et al. ..................... 257/315

* cited by examiner

*Primary Examiner* — Selim Ahmed
(74) *Attorney, Agent, or Firm* — IP & T Group LLP (57) ABSTRACT

A method for fabricating a non-volatile memory device, the method includes alternately stacking inter-layer dielectric layers and sacrificial layers over a substrate, etching the inter-layer dielectric layers and the sacrificial layers to form trenches to expose a surface of the substrate, etching the inter-layer dielectric layers exposed by the trenches to a predetermined thickness, forming junction layers over etched portions of the inter-layer dielectric layers, and burying a layer for a channel within the trenches in which the junction layers have been formed to form a channel.

8 Claims, 10 Drawing Sheets

NON-VOLATILE MEMORY DEVICE HAVING THREE DIMENSIONAL, VERTICAL CHANNEL, ALTERNATELY STACKED GATE ELECTRODE STRUCTURE

CROSS-REFERENCES TO RELATED APPLICATIONS

This application is division of U.S. patent application Ser. No. 12/814,009 filed on Jun. 11, 2010, which claims priority of Korean Patent Application Nos. 10-2009-0052351 and 10-2010-0018724, filed on Jun. 12, 2009 and Mar. 2, 2010, respectively. The disclosure of each of the foregoing applications is incorporated herein by reference in their entirety.

BACKGROUND OF THE INVENTION

Exemplary embodiments of the present invention relate to a non-volatile memory device and a method for fabricating the same, and more particularly, to a non-volatile memory device having a three-dimensional structure and a vertical channel structure.

A non-volatile memory device retains data even when power is interrupted. As a memory device having a two-dimensional structure in which memory cells are arranged on a silicon substrate in a single layer reaches a limit in improving the integration density of the memory device, a non-volatile memory device having a three-dimensional structure in which memory cells are vertically stacked on a silicon substrate has been proposed.

A method for fabricating a conventional non-volatile memory device having a three-dimensional structure will be described below in detail with reference to FIG. 1.

Figure 1:
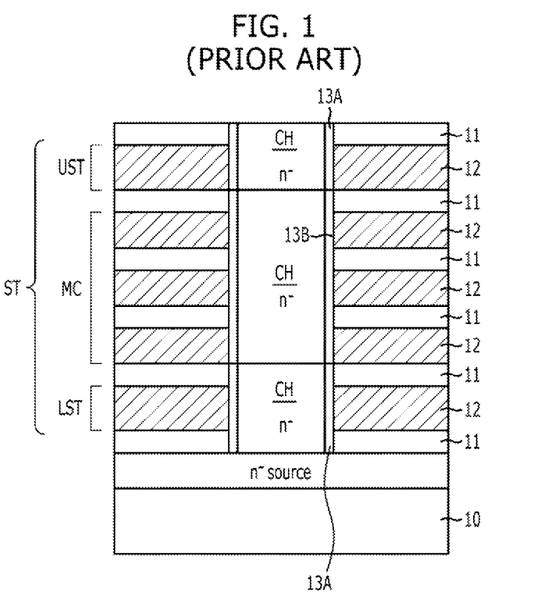
FIG. 1 is a cross-sectional view illustrating a conventional non-volatile memory device having a three-dimensional structure.

FIG. 1 is a cross-sectional view illustrating a conventional non-volatile memory device having a three-dimensional structure. Specifically, FIG. 1 illustrates a non-volatile memory device having a three-dimensional structure and a vertical channel structure.

Referring to FIG. 1, the conventional non-volatile memory device having the vertical channel structure includes a lower select transistor (LST), a plurality of memory cells (MC) and an upper select transistor (UST) sequentially stacked above a substrate 10 along a channel vertically protruding from the substrate 10. Thus, a string is vertically arranged on the substrate 10.

Also, the conventional non-volatile memory device includes a common source region doped with an N-type impurity in the substrate 10. A plurality of strings composing a memory block are connected to the common source region in parallel. Specifically, a channel doped with an N-type impurity is connected to the common source region doped with the N-type impurity.

A method for fabricating the conventional non-volatile memory device having the three-dimensional structure will be described below in detail.

A source region is formed by doping an impurity into the substrate 10. A plurality of inter-layer dielectric layers 11 and a plurality of conductive layers 12 for gate electrodes are alternately formed on the substrate 10 in which the source region is formed.

The inter-layer dielectric layers 11 and the conductive layers 12 for gate electrodes are selectively etched to form a trench which exposes the surface of the substrate 10, and an insulation layer is formed inside of the trench. For example, when the lower select transistor and the upper select transistor are formed, a gate insulation layer 13A is formed on the inner wall of the trench. When the memory cells are formed, a charge blocking layer, a charge trap layer, and a tunnel insulation layer 13B are sequentially formed on the inner wall of the trench.

The trench having the gate insulation layer 13A or the charge blocking layer, the charge trap layer, and the tunnel insulation layer 13B is filled with a layer for a channel to form a channel (CH). Thus, a lower select transistor (LST), a plurality of memory cells (MC) and an upper select transistor (UST) are sequentially formed over the substrate 10 along the channel CH vertically protruding from the substrate 10.

However, according to the method for fabricating the conventional non-volatile memory device, it is impossible to fabricate a non-volatile memory device having the memory cells operating in an enhancement-mode due to the limitations of the fabrication processes.

In the conventional non-volatile memory device having the three-dimensional structure, the memory cells stacked along the channel protrude vertically from the substrate 10. Herein, the channel is formed by etching the inter-layer dielectric layers 11 and the conductive layers 12 to form the trench, and filling the trench with the layer for a channel. Thus, it is impossible to form a junction, i.e., source/drain region, in the channel between the memory cells.

In the conventional non-volatile memory device, the source region doped with the N-type impurities is formed in the substrate 10, and the channel doped with the N-type impurities forms the memory cells operating in a depletion mode.

Meanwhile, the memory cells operating in the depletion mode process elimination operations by providing holes through a gate induced drain leakage (GIRL) effect in the source region of the lower select transistor. If an insufficient amount of holes are provided, the speed of the elimination operations is lowered. Specifically, since the string is vertically arranged on the substrate 10, the length of the channel is increased, and the supply of the holes becomes difficult. Thus, the speed of the elimination operations is degraded. As a result, the performance of the non-volatile memory device is reduced.

SUMMARY OF THE INVENTION

Exemplary embodiments of the present invention are directed to a non-volatile memory device having a three-dimensional structure which includes a memory cell operating in an enhancement-mode, and a method of fabricating the memory devices.

In accordance with an exemplary embodiment of the present invention, a non-volatile memory device includes inter-layer dielectric layers and gate electrodes alternately stacked over a substrate, channels passing through the inter-layer dielectric layers and the gate electrodes and protruding from the substrate, and junction layers disposed between the channels and the inter-layer dielectric layers.

In accordance with another exemplary embodiment of the present invention, a method for fabricating a non-volatile memory device includes alternately stacking inter-layer dielectric layers and sacrificial layers over a substrate, etching the inter-layer dielectric layers and the sacrificial layers to form trenches to expose the surface of the substrate, etching the inter-layer dielectric layers exposed by the trenches to a predetermined thickness, forming junction layers over the etched portions of the inter-layer dielectric layers, and burying a layer for a channel within the trenches in which the junction layers are formed to form a channel.

In accordance with still another exemplary embodiment of the present invention, a method for fabricating a non-volatile memory device includes forming a well region over a substrate, forming a common source region within the well region, alternately stacking inter-layer dielectric layers and conductive layers over the substrate having the common source region, etching the inter-layer dielectric layers and the conductive layers to form a trench to expose the surface of the substrate, forming a pickup region over the well region by doping an impurity into the substrate exposed by the trench, and burying a layer for a channel within the trench to form a channel.

In accordance with yet another exemplary embodiment of the present invention, a non-volatile memory device includes memory cells stacked along a channel vertically protruding from a substrate, a well region arranged in the substrate, a common source region arranged within the well region, and a pickup region arranged in the substrate to connect the channel to the well region.

DESCRIPTION OF EXEMPLARY EMBODIMENTS

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being a second layer or "on" a substrate, it not only refers to a case where the first layer is formed directly on the second layer or the substrate but also a case where a third layer exists between the first layer and the second layer or the substrate.

FIGS. 2A to 2F are cross-sectional views illustrating a method for fabricating a non-volatile memory device having a three-dimensional structure in accordance with a first embodiment of the present invention. For convenience, a lower select transistor and an upper select transistor are not illustrated, and FIGS. 2A to 2F focus on a process of forming a plurality of memory cells.

Figure 2A:
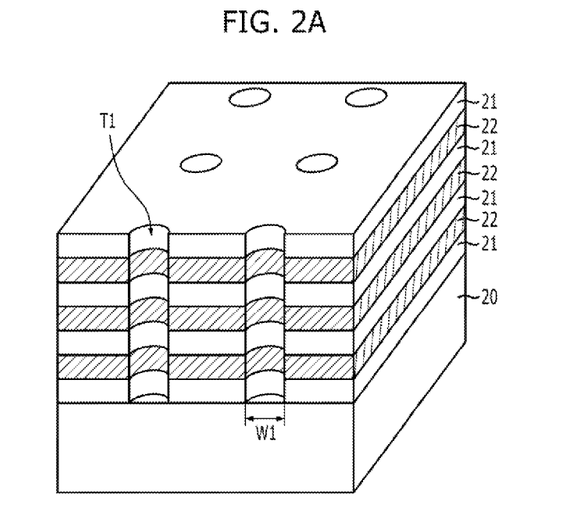
FIGS. 2A to 2F are cross-sectional views illustrating a method for fabricating a non-volatile memory device having a three-dimensional structure in accordance with a first exemplary embodiment of the present invention.

Referring to FIG. 2A, a plurality of inter-layer dielectric layers 21 and a plurality of sacrificial layers 22 are alternately formed on a substrate 20. The inter-layer dielectric layers 21 serve to separate a plurality of memory cells stacked along a channel formed by the subsequent processes. The inter-layer dielectric layers 21 may be formed of an oxide layer or a nitride layer.

The width of a junction layer formed by the subsequent processes is determined by the thickness of the inter-layer dielectric layers 21. Thus, the thickness of the inter-layer dielectric layers 21 may be determined in consideration of the width of the junction layer. For example, in order to increase the width of the junction layer, the thickness of the inter-layer dielectric layers 21 should be increased.

The sacrificial layers 22 serve to secure regions where a charge blocking layer, a charge trap layer, and a tunnel insulation layer and a gate electrode may be formed by the subsequent processes. The sacrificial layers 22 may be formed of a material having a high etch selectivity with respect to the inter-layer dielectric layers 21. For example, when the inter-layer dielectric layers 21 may be formed of an oxide layer, the sacrificial layers 22 may be formed of a nitride layer. Also, when the inter-layer dielectric layers 21 may be formed of a nitride layer, the sacrificial layers 22 may be formed of an oxide layer.

A plurality of trenches T1 for channels are formed by etching the inter-layer dielectric layers 21 and the sacrificial layers 22. Herein, the plurality of trenches T1 may be cylinders and may be arranged a predetermined distance apart from each other. The reference designation "W1" represents a first width of the trenches T1.

Figure 2B:
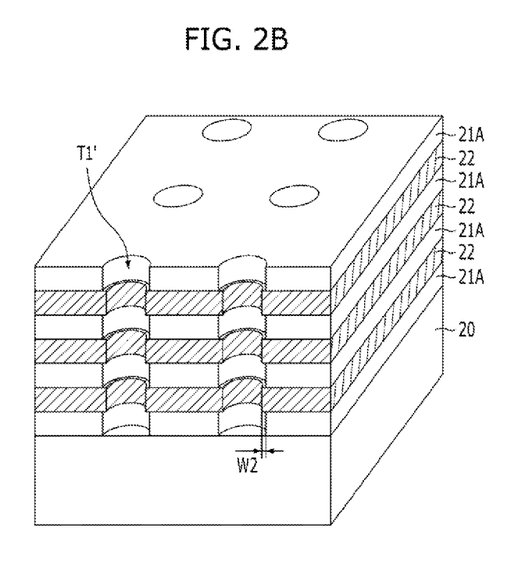

Referring to FIG. 2B, the inter-layer dielectric layers 21 exposed by the trenches T1 may be etched to a second width W2. The reference designation "21A" represents etched inter-layer dielectric layers, and the reference designation "T1'" represents trenches extended through the etch process. Herein, the etch process of the inter-layer dielectric layers 21 to the second width W2 secures an area where the junction layer may be formed through the subsequent processes. The second width W2, that is the etched width of the inter-layer dielectric layers 21, may be determined in consideration of the width of the junction layer. For example, the inter-layer dielectric layers 21 may be etched to the same thickness as the final width of the junction layer in the embodiments of the present invention. The etch process of the inter-layer dielectric layers 21 may include a wet etch process.

Figure 2C:
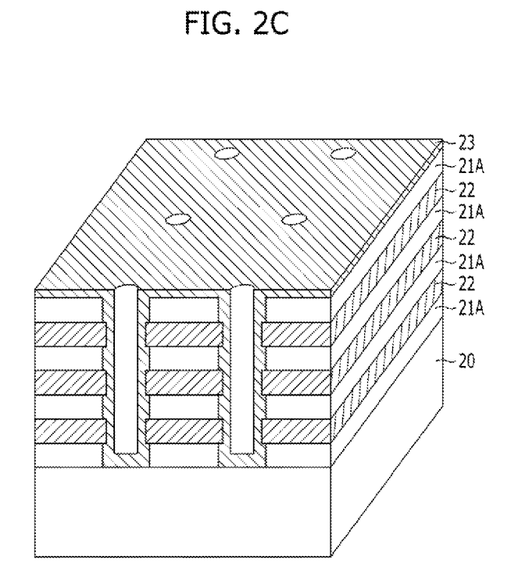

Referring to FIG. 2C, a first material layer for the junction 23 may be formed over a bottom portion and an inner portion of the extended trenches T1' while the etched portions of the etched inter-layer dielectric layers 21A are buried. The first material layer for the junction 23 may serve to form a junction, i.e., the source/drain regions of the plurality of memory cells stacked along the channel. The first material layer for the junction 23 may include a polysilicon layer doped with an N-type impurity. The doping concentration of the impurity may be in a range of from approximately $1E10/cm^2$ to approximately $1E15/cm^2$.

Also, the first material layer for the junction 23 may be formed with a thickness to sufficiently bury the etched portions of the etched inter-layer dielectric layers 21A.

Figure 2D:
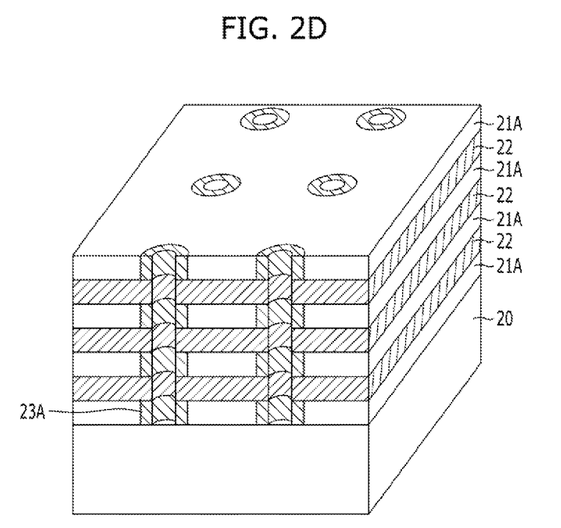

Referring to FIG. 2D, a portion of the first material layer for the junction 23 may be removed, except for the first material layer for the junction 23 formed within the etched portions of the etched inter-layer dielectric layers 21A. Thus, junction layers 23A may be formed within the etched portions of the etched inter-layer dielectric layers 21A, and the junction layers 23A may be separated from each other through a removal process.

Figure 2E:
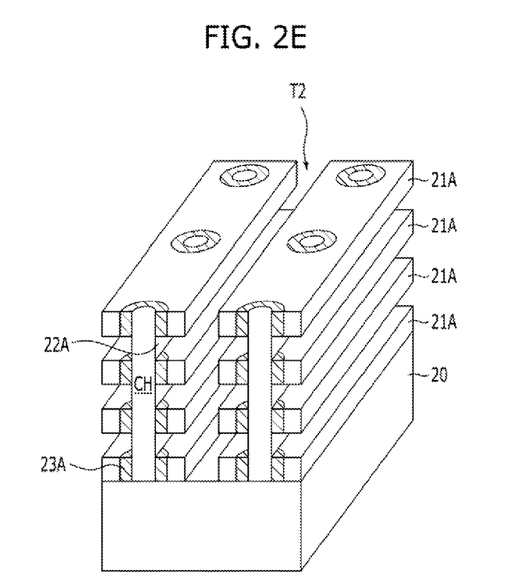

Referring to FIG. 2E, a layer for the channel may be formed in trenches including the junction layers 23A to form a plurality of channels protruding from the substrate 20. Herein, the layer for the channel may be a polysilicon layer doped with a P-type impurity.

The etched inter-layer dielectric layers 21A and the sacrificial layers 22 disposed between the plurality of channels may be etched to form a trench T2 for removing the sacrificial layers 22. Herein, the trench T2 for removing the sacrificial layers 22 may be a line-type trench, and may have a sufficient depth to expose all sides of the sacrificial layers 22.

The sacrificial layers 22 exposed by the trench T2 may be removed to expose channels spaced a predetermined distance apart from each other. The removing process of the sacrificial layers 22 may be performed under a condition having a high etch selectivity with respect to the etched inter-layer dielectric layers 21A. For example, when the sacrificial layers 22 may be formed of an oxide in layer and the etched inter-layer dielectric layers 21A may be formed of a nitride layer, HF or BOE may be used to remove the sacrificial layers 22. In this case, the etch selectivity of the sacrificial layers 22 with respect to the etched inter-layer dielectric layers 21A is greater than approximately 50:1.

Also, when the sacrificial layers 22 may be formed of a nitride layer and the etched inter-layer dielectric layers 21A may be formed of an oxide layer, phosphoric acid may be used to remove the sacrificial layers 22. In this case, the etch selectivity of the sacrificial layers 22 with respect to the etched inter-layer dielectric layers 21A is greater than approximately 20:1.

Here, all of the sacrificial layers 22 may be removed or a portion of the sacrificial layers 22A located between the channels may remain during the removing process. FIG. 2E shows a case of a portion of the sacrificial layers 22A located between the channels remaining.

Figure 2F:
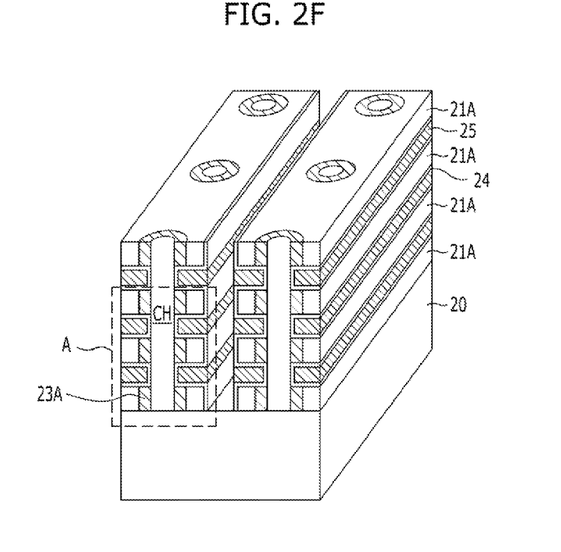

Referring to FIG. 2F, a charge blocking layer, a charge trap layer, and a tunnel insulation layer may be formed over the resultant structure in which a portion of the sacrificial layers 22 has been removed. In FIG. 2F, the charge blocking layer, the charge trap layer, and the tunnel insulation layer are illustrated as a single layer. Reference designation "24" represents the layer including the charge blocking layer, the charge trap layer, and the tunnel insulation layer.

The charge blocking layer, the charge trap layer, and the tunnel insulation layer 24 may be formed along the removed region of the sacrificial layers 22 with a predetermined thickness such that a middle region of the removed region of the sacrificial layers 22 may remain open.

Then, a gate electrode 25 may be buried in the removed region of the sacrificial layers 22. That is, the gate electrode 25 may be formed within the open middle layer after the charge blocking layer, the charge trap layer, and the tunnel insulation layer 24 have been formed. Specifically, the gate electrode 25 may be formed within the open middle region by forming a conductive layer over the resultant structure including the charge blocking layer, the charge trap layer, and the tunnel insulation layer 24, and performing an etch-back process onto the conductive layer.

As a result, the plurality of memory cells may be stacked along the channels, and the memory cells may include the channel CH, the charge blocking layer, the charge trap layer, and the tunnel insulation layer 24, and the gate electrode 25.

As described above, the non-volatile memory device having the three-dimensional structure in accordance with the first embodiment of the present invention may include the etched inter-layer dielectric layers 21A and the gate electrodes 25 alternatively stacked over the substrate 20, the channel CH protruding from the substrate 20 and formed through the etched inter-layer dielectric layers 21A and the gate electrodes 25, junction layers 23A surrounding an outer surfaces of the channel a predetermined distance apart from each other and disposed between the channel and the etched inter-layer dielectric layers 21A, and the memory cells stacked along the channel.

The memory cells may further include the charge blocking layer, the charge trap layer, and the tunnel insulation layer 24 disposed between the channel and the gate electrodes 25. The non-volatile memory device having the three-dimensional structure may further include the remaining sacrificial layer 22A located between the channels arranged in a predetermined direction and formed as the same layer as the gate electrodes 25. Also, the memory cells may be configured to operate in an enhancement-mode by the N-type junction layers 23A formed on both side of the channel.

FIGS. 3A to 3D are cross-sectional views illustrating a method for fabricating a non-volatile memory device having a three-dimensional structure in accordance with a second embodiment of the present invention. Details of elements corresponding to those of the first embodiment have been omitted for the sake of brevity.

Figure 3A:
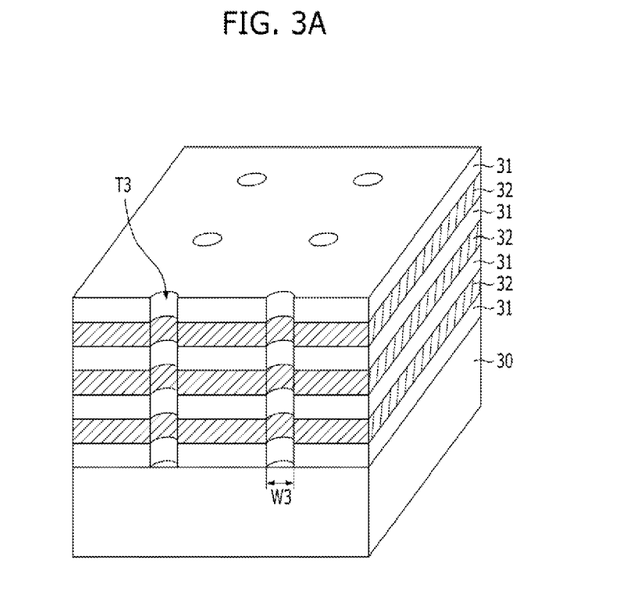
FIGS. 3A to 3D are cross-sectional views illustrating a method for fabricating a non-volatile memory device having a three-dimensional structure in accordance with a second exemplary embodiment of the present invention.

As shown in FIG. 3A, a plurality of inter-layer dielectric layers 31 and a plurality of sacrificial layers 32 may be alternately formed on a substrate 30. A plurality of trenches T3 for channels may be formed by etching the inter-layer dielectric layers 31 and the sacrificial layers 32. The reference designation "W3" represents a third width of the trenches T3.

According to the second embodiment of the present invention, the third width W3 may be determined in consideration of the subsequent processes when the trenches T3 for the channels are formed, since the third width W3 of the trenches T3 is extended through the subsequent processes.

Figure 3B:
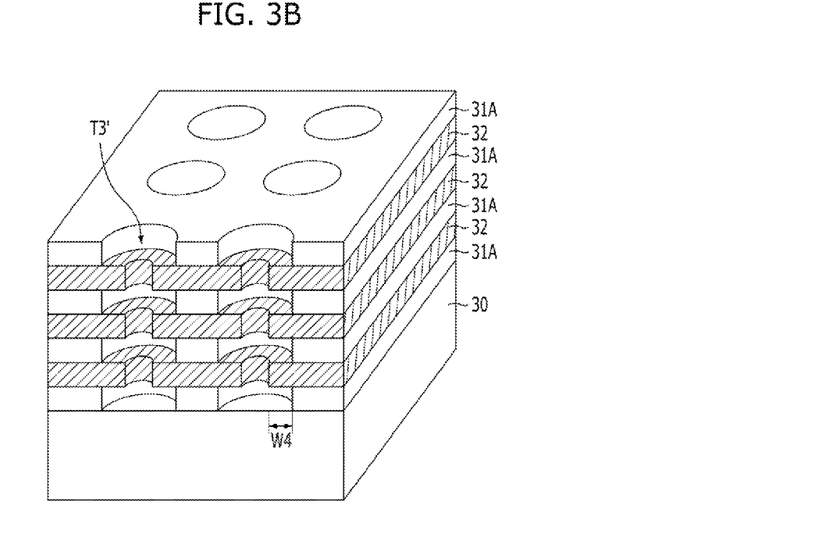

Referring to FIG. 3B, the inter-layer dielectric layers 31 exposed by the trenches T3 may be etched to a fourth width W4. The fourth width, that is, the etched width of the inter-layer dielectric layers, may be greater than a final width of a junction layer in a range of from approximately 1% to approximately 20%. That is, the inter-layer dielectric layers 31 may be over-etched. The reference designation "31A" represents etched inter-layer dielectric layers, and "T3'" represents trenches extended by the etch process.

Figure 3C:
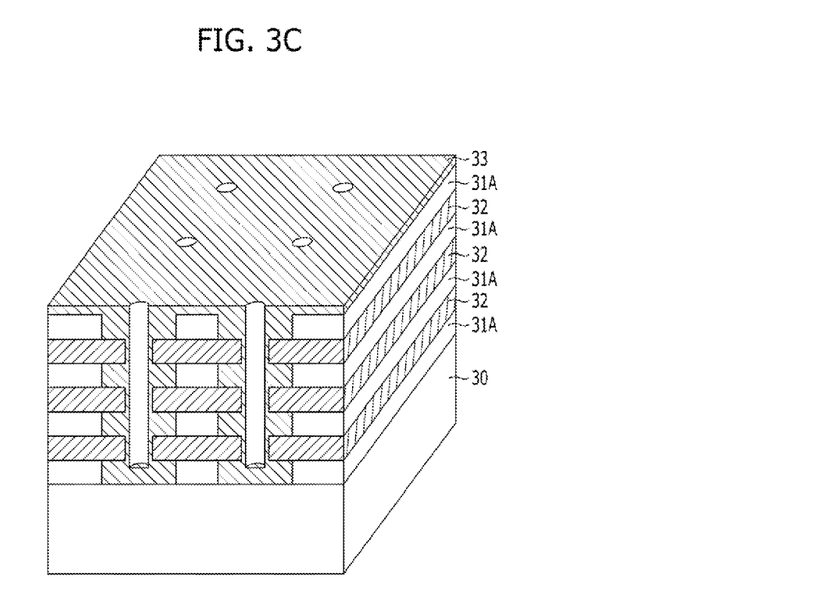

Referring to FIG. 3C, a second material layer for the junction 33 may be formed over a bottom portion and an inner portion of the extended trenches T3' while the over-etched portions of the etched inter-layer dielectric layers 31A are buried. The second material layer for the junction 33 may serve to form a junction, source/drain regions of the plurality of memory cells stacked along the channel. The second material layer for the junction 33 may include a polysilicon layer doped with an N-type impurity. The doping concentration of the impurity may be in a range of from approximately $1E10/cm^2$ to approximately $1E15/cm^2$.

Also, the second material layer for the junction 33 may be formed with a thickness to sufficiently bury the over-etched portions of the etched inter-layer dielectric layers 31A.

Figure 3D:
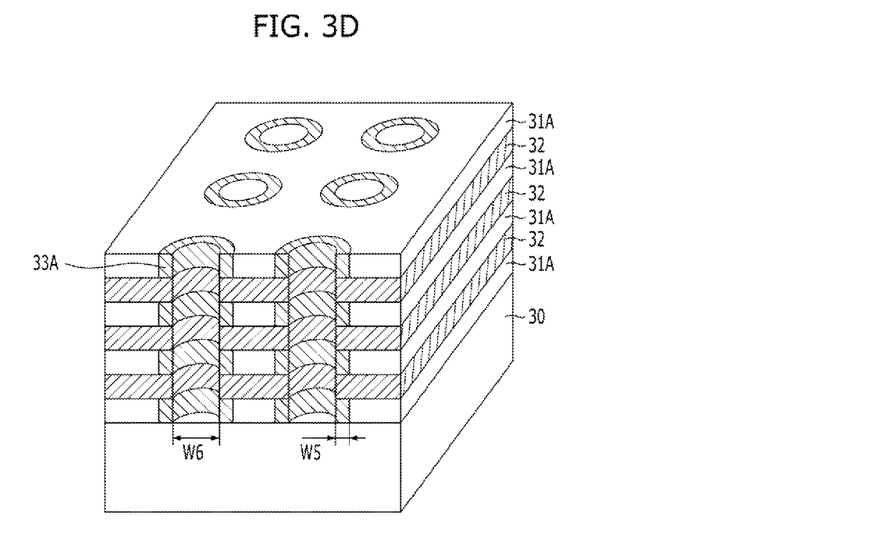

Referring to FIG. 3D, portions of the second material layer for the junction 33 formed over a bottom portion and an inner portion of each of the extended trenches T3', portions of the second material layer for the junction 33 formed within the over-etched portions of the etched inter-layer dielectric layers 31A, and portions of sacrificial layers 32 may be removed to form a plurality of junction layers 33A.

That is, the second material layer for the junction 33 may be etched to a width obtaining by subtracting a final width W5 of the junction layers 33A from a width of the second material layer for the junction 33 burying the over-etched portions of the etched inter-layer dielectric layers 31A. The junction layers 33A have a fifth width W5, and the third width W3 of the trenches T3 may be extended to a sixth width W6. Thus, junction layers 33A may be completely separated from each other through the removal process.

Subsequent processes for forming a channel and a gate electrode may be performed to form the non-volatile memory device having a three-dimensional structure in the same manner as that of the first embodiment of the present invention.

Figure 4:
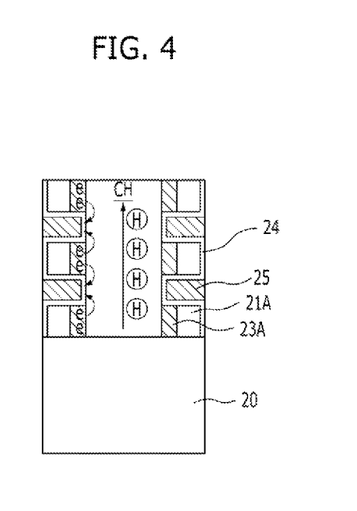
FIG. 4 is a diagram illustrating an operation of the non-volatile memory device having a three-dimensional structure in accordance with an exemplary embodiment of the present invention.

FIG. 4 is a diagram illustrating an operation of the non-volatile memory device having a three-dimensional structure in accordance with an embodiment of the present invention. FIG. 4 is a magnified view of 'A' of FIG. 2F.

As shown in FIG. 4, the non-volatile memory device having the three-dimensional structure in accordance with an embodiment of the present invention may include N-type junction layers 23A formed on both sides and a P-type channel CH in a plurality of the memory cells.

The junction layers 23A may serve as source/drain regions. Since N-type impurities may be doped in the junction layers 23A, sufficient electrons may be provided during the program operation of the memory cell. Also, since P-type impurities may be doped in the channel, sufficient holes may be provided during the elimination operation of the memory cell. Therefore, the enhancement-mode operation of the memory cells is possible.

Figure 5A:
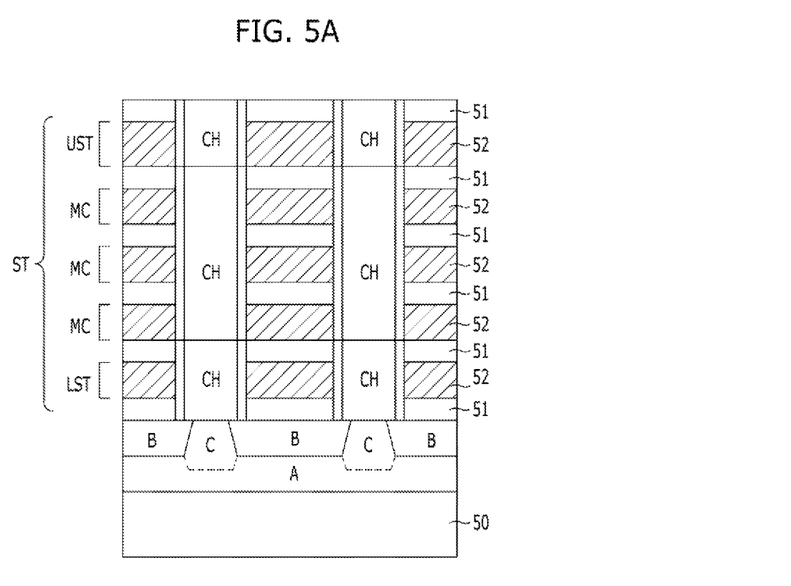
FIGS. 5A and 5B illustrate a non-volatile memory device having a three-dimensional structure in accordance with a third exemplary embodiment of the present invention.
Figure 5B:
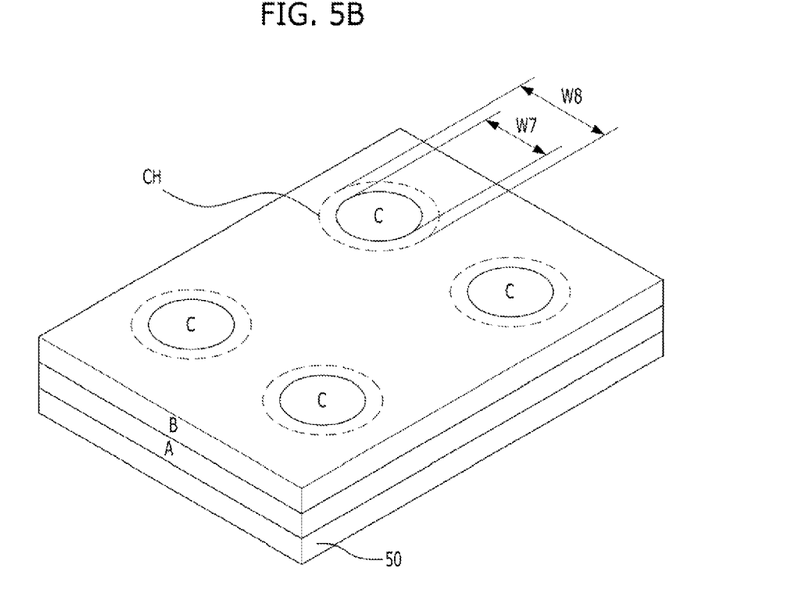

FIGS. 5A and 5B illustrate a non-volatile memory device having a three-dimensional structure in accordance with a third embodiment of the present invention.

FIG. 5A illustrates a cross-sectional view of a vertical channel type non-volatile memory device having a three-dimensional structure in accordance with a third embodiment of the present invention.

As shown in FIG. 5A, the non-volatile memory device may include a lower select transistor (LST), a plurality of memory cells (MC) and an upper select transistor (UST) sequentially stacked above a substrate 50 along a channel vertically protruding from the substrate 50. Thus, a string is vertically arranged on the substrate 50.

Also, the substrate 50 may include a well region A, a common source region B and a pickup region C in order to form memory cells operated in an enhancement-mode. The common source region B and the pickup region C may be formed within the well region A.

The pickup region C may connect the well region A and the channel CH, and the pickup region C may be formed by selectively doping impurities into the substrate 50 having the common source region B. For example, a material layer may be formed over a substrate, and a trench may be formed by etching the material layer to expose surfaces of the substrate. The pickup region C may then be formed by doping impurities into the exposed surfaces of the substrate disposed on the lower part of the trench. The impurities may be doped after forming a spacer on an inner wall of the trench.

FIG. 5B illustrates a perspective view of a substrate structure having a well region A, a common source region B and a pickup region C.

As shown in FIG. 5B, the well region A and the common source region B may be formed within the substrate 50; a plurality of pickup regions C may be formed a predetermined distance apart from each other to connect the well region A to the channels CH of the string ST.

A width W7 of the pickup region C may be smaller than a width W8 of the channel CH. Thus, a portion of the channel CH may be electrically connected to the common source region B and the rest of the channel CH may be connected to the well region A through the pickup region C. For example, when a pillar-type channel is formed, the edge of the pillar-type channel may be connected to the common source region B, and the middle of the channel may be electrically connected to the well region A through the pickup region C.

Consequently, the vertical channel non-volatile memory device having memory cells operated in an enhancement-mode may be fabricated.

FIGS. 6A to 6E are cross-sectional views illustrating a method for fabricating a non-volatile memory device having a three-dimensional structure in accordance with the third embodiment of the present invention.

Figure 6A:
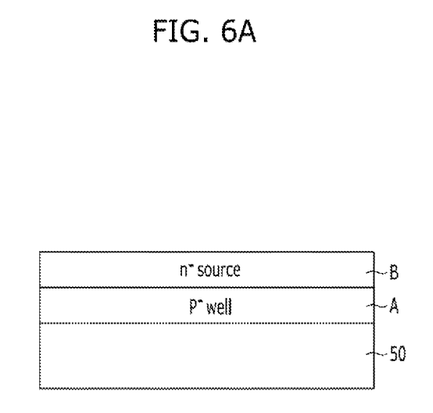
FIGS. 6A to 6E are cross-sectional views illustrating a method for fabricating a non-volatile memory device having a three-dimensional structure in accordance with the third exemplary embodiment of the present invention.

As shown in FIG. 6A, a first conductive-type well region A may be formed by doping a first conductive-type impurity into a substrate 50. A second conductive-type common source region B may be formed by doping a second conductive-type impurity into the substrate 50 having the first conductive-type well region A.

Herein, the first conductive-type impurity and the second conductive-type impurity have different conductive characteristics. For example, the first conductive-type may be a P type while the second conductive-type may be an N type. Thus, the well region A and the common source region B, having a different conductive-type from that of the well region A, may be formed in the substrate 50.

Figure 6B:
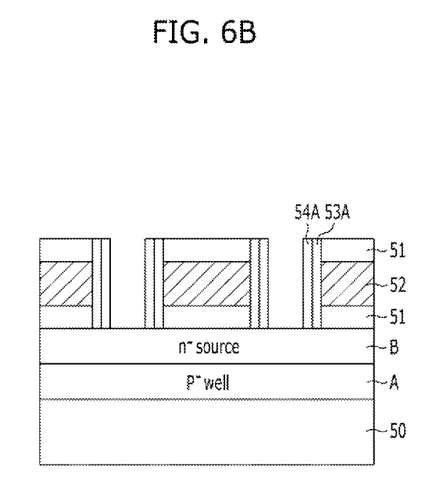

As shown in FIG. 6B, a plurality of inter-layer dielectric layers 51 and a conductive layer 52 for a gate electrode may be alternately formed on the substrate 50 in which the well region A and the common source region B are formed. In FIG. 6B, a first inter-layer dielectric layer, the conductive layer for the gate electrode, and a second inter-layer dielectric layer are shown to extend from a lower select transistor.

The inter-layer dielectric layers 51 and the conductive layer 52 for the gate electrode may be selectively etched to form a trench to expose the surface of the substrate 50, and a gate insulation layer 53A and a spacer 54A may be sequentially formed on an inner wall of the trench.

The spacer 54A may be formed to secure an overlap region between a source region of the lower select transistor and the common source region B. The spacer 54A may be formed of a nitride layer, a carbon layer or a conductive layer. When the spacer 54A is formed of the conductive layer, the spacer 54A may be formed of the same material as a channel layer which is to be formed by a subsequent process. The spacer 54A may be formed of a polysilicon layer.

A first material layer for the gate insulation layer and a second material layer for the spacer may be formed over the resultant structure having the trench; the surface of the substrate 50 may be exposed by an etch-back process. Since the etch-back process may be performed after the first material layer for the gate insulation layer and the second material layer for the spacer have been formed, a loss of the first material layer for the gate insulation layer may be prevented. Also, the spacer 54A may be formed after the gate insulation layer 53A is formed.

Herein, the surface of the substrate 50 exposed by the etch-back process may be a region for a pickup region to be formed by the subsequent process. At this step, the second conductive-type common source region S may be exposed as the surface of the substrate 50.

Figure 6C:
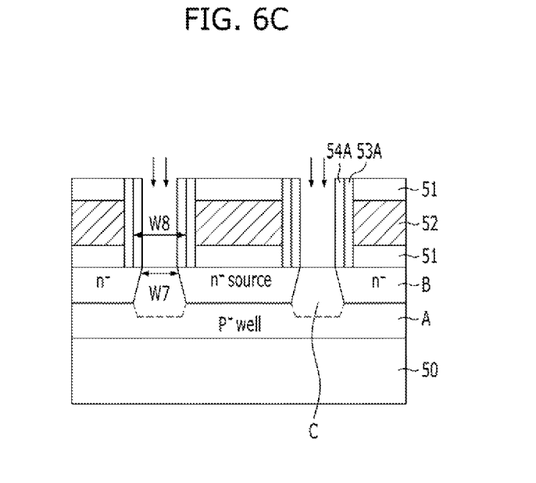

As shown in FIG. 6C, the pickup region C may be formed in the substrate 50. The pickup region C may be formed by doping the first conductive-type impurity into the exposed substrate 5, thus, the second conductive-type common source region B may be changed to a first conductive-type pickup region C. By doping the exposed substrate 50 with the same conductive-type impurity of the well region A, the pickup region C may be connected to the well region A.

The pickup region C may be formed to connect a channel to the well region A through the common source region. B. The pickup region C may be formed by various methods including an impurity doping method. For example, the pickup region C may be formed by etching the common source region B exposed by the trench to expose the well region, and filling the first conductive-type material layer within the etched region.

Since the spacer 54A is formed on an inner wall of the trench, a width W7 of the pickup region C may be smaller than the width W8 of the channel. As described above, the channel may be electrically connected to the well region A by forming the pickup region C; the source region of the lower select transistor and the common source region B may be overlapped by adjusting the width W7 of the pickup region C. A width of the overlapped region may be adjusted by the width of the spacer 54A.

Figure 6D:
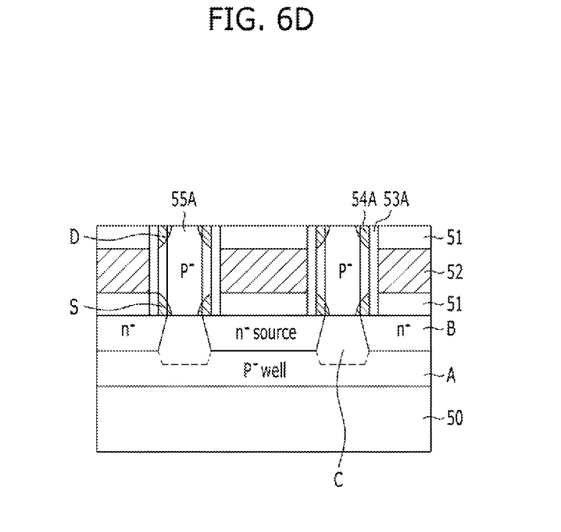

As shown in FIG. 5D, a first conductive-type layer for the channel fills the trench, and a first conductive-type channel 55A may be formed. The first conductive-type channel 55A may be connected to the well region A through the pickup region C. That is, the channel 55A may be formed with the same conductive-type as that of the well region A, and thus, the channel 55A may be electrically connected to the well region A through the pickup region C.

Herein, the layer for the channel may be formed of a polysilicon layer. When the spacer 54A is formed of polysilicon, the spacer 54A may serve as the channel. However, the spacer 54A may be formed of a nitride layer or a carbon layer; the layer for the channel may be filled in the trench after the spacer 54A has been removed.

Also, when the layer for the channel is filled in the trench, the source/drain regions of the lower select transistors may be formed by performing a gas doping process. For example, the source/drain regions may be formed by selectively doping the second conductive-type impurity inside the channel 55A on both sides of each inter-layer dielectric layer 51. The source/drain regions may have the same conductive characteristics as that of the common source region B.

The source/drain regions of the lower select transistors may be formed inside the channel 55A on both sides of each inter-layer dielectric layer 51. The source region S may overlap the common source region B. Thus, the source regions S of the lower select transistors included in a plurality of strings composing a memory block may be connected to the common source region B, the lower select transistors operating in an enhancement-mode.

Although the source/drain regions may not be formed separately, the lower select transistors may be operated by using a fringe field. That is a gate bias having a predetermined level may be applied to the gate electrode of a lower select transistor, a junction is turned on, and thus, the lower select transistor may be operated.

Figure 6E:
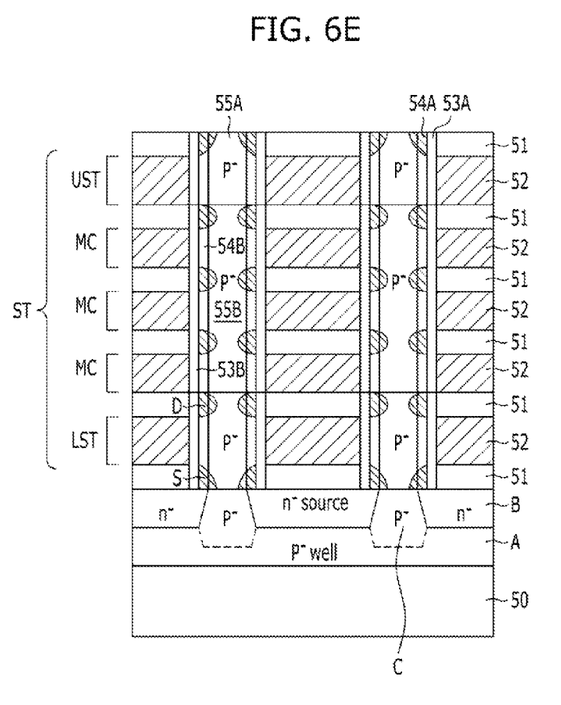

As shown in FIG. 6E, a plurality of memory cells MC and upper select transistors UST are formed over the resultant structure having the lower select transistors LST. Hereinafter, processes for forming memory cells will be described.

A plurality of inter-layer dielectric layers 51 and a plurality of conductive layers 52 for gate electrodes may be alternately formed over the resultant structure in which the lower select transistors LST are formed. The inter-layer dielectric layers 51 and the conductive layers 52 for the gate electrodes may be selectively etched to form a trench which exposes the channel 55A of the lower select transistors.

A charge blocking layer, a charge trap layer, and a tunnel insulation layer 53B may be sequentially formed on the inner wall of the trench. Also, a spacer 54B may be formed over the charge blocking layer, the charge trap layer, and the tunnel insulation layer 53B to protect the charge blocking layer, the charge trap layer, and the tunnel insulation layer 53B during the subsequent etch-back process.

Then, a channel 55B may be formed by filling the trench with a layer for the channel. The memory cells stacked along the channel 55B are formed, and the channel vertically protrudes from the substrate 50. The source/drain regions of the memory cells may be formed by performing the gas doping process in the same manner as that of the lower select transistors.

Furthermore, the upper select transistors UST may be formed over the resultant structure in which the memory cells are formed. Processes for forming the upper select transistors may be the same as those of the lower select transistors.

As a result, a vertical channel type non-volatile memory device having a three-dimensional structure including the lower select transistors, memory cells and the upper select transistors configured to operate in the enhancement-mode may be formed. Therefore, the performance of the memory device may be improved by increasing the speed of the program operations and the elimination operations.

Referring to FIGS. 6A to 6E, according an impurity doping method to form the pickup region C, the P-type well region A, the N-type common source region B and the P-type pickup region C may be formed in the substrate 50, and the P-type channel CH may be connected to the P-type well region A through the P-type pickup region C. That is, the first conductive-type may be the P-type while a second conductive-type may be the N-type. However, the conductive-type may be changed based on the design. In the present invention, the channel CH and the well region A having the same conductive-type may be connected through the pickup region C.

In accordance with the embodiments of the present invention, source/drain regions, i.e., junction regions may be in a plurality of memory cells stacked along a channel which protrudes vertically from a substrate. Accordingly, a non-volatile memory device having a three-dimensional structure which includes memory cells operating in an enhancement-mode may be provided.

Furthermore, in accordance with the embodiments of the present invention, since a well region, a common source region and a pickup region may be formed in a substrate, a channel may be connected to the well region through the pickup region. Specifically, a first conductive-type well region, a second conductive-type common source region and a first conductive-type pickup region may be formed, and a first conductive-type channel may be connected to the first conductive-type well region through the first conductive-type pickup region. Thus, a non-volatile memory device having a three-dimensional structure which includes memory cells operating in an enhancement-mode may be provided.

While the present invention has been described with respect to the specific embodiments, it will be apparent to those skilled in the art that various changes and modifications may be made without departing from the spirit and scope of the invention as defined by the following claims.

What is claimed is:

1. A non-volatile memory device comprising:
   a plurality of memory cells stacked along a channel vertically protruding from a substrate;
   a well region arranged in the substrate;
   a common source region arranged within the well region; and
   a pickup region arranged in the substrate to connect the channel to the well region,
   wherein a conductive-type of the well region is the same as that of the pickup region and the channel, and the conductive-type of the well region is different from that of the common source region.

2. The non-volatile memory device of claim 1, wherein the plurality of memory cells are configured to operate in an enhancement-mode.

3. The non-volatile memory device of claim 1, wherein a width of the pickup region is smaller than a width of the channel.

4. The non-volatile memory device of claim 1, wherein the channel is electrically connected to the well region through the pickup region.

5. The non-volatile memory device of claim 1, wherein the plurality of memory cells include:
   a plurality of inter-layer dielectric layers and a plurality of gate electrodes alternately stacked over a substrate;
   a plurality of channels passing through the plurality of inter-layer dielectric layers and the plurality of gate electrodes and protruding from the substrate; and
   a plurality of junction layers disposed between the plurality of channels and the plurality of inter-layer dielectric layers.

6. The non-volatile memory device of claim 5, further comprising:
   a charge blocking layer, a charge trap layer, and a tunnel insulation layer disposed between the plurality of channels and the plurality of gate electrodes.

7. The non-volatile memory device of claim 5, wherein the plurality of channels are doped with a P-type impurity, and the plurality of junction layers are doped with an N-type impurity.

8. The non-volatile memory device of claim 7, wherein a doping concentration of the N-type impurity is in a range of from approximately $1E10/cm^2$ to approximately $1E15/cm^2$.

* * * * *